United States Patent [19]
Kumagai

[11] Patent Number: 5,473,182
[45] Date of Patent: Dec. 5, 1995

[54] SEMICONDUCTOR DEVICE

[75] Inventor: Kouichi Kumagai, Tokyo, Japan

[73] Assignee: NEC Corporation, Tokyo, Japan

[21] Appl. No.: 286,993

[22] Filed: Aug. 8, 1994

Related U.S. Application Data

[63] Continuation of Ser. No. 84,604, Jul. 1, 1993, abandoned.

[30] Foreign Application Priority Data

Jul. 1, 1992 [JP] Japan ..................... 4-173924

[51] Int. Cl.⁶ .................................. H01L 29/06
[52] U.S. Cl. .................. 257/355; 257/360; 257/361; 257/362; 257/560
[58] Field of Search ................... 257/203, 355, 257/356, 360, 361, 362, 557, 560, 563, 564

[56] References Cited

U.S. PATENT DOCUMENTS

T934,009  5/1975  Sheng ..................... 257/560

FOREIGN PATENT DOCUMENTS

| | | | |
|---|---|---|---|
| 61-152068 | 7/1986 | Japan | 257/560 |
| 61-144843 | 8/1986 | Japan | 257/203 |
| 62-114259 | 5/1987 | Japan | 257/203 |
| 63-54762 | 3/1988 | Japan . | |

*Primary Examiner*—J. Carroll
*Attorney, Agent, or Firm*—Sughrue, Mion, Zinn, Macpeak & Seas

[57] ABSTRACT

A semiconductor device has protective devices formed in a P-type semiconductive region maintained at a ground potential and disposed adjacent to bonding pads connected to internal circuitry through respective signal lines. A plurality of first N+ diffusion regions connected to respective signal lines and a second diffusion region connected to a ground line are disposed in the P-type semiconductive region. A separating region having a thick insulating layer is disposed between the first diffusion regions and the second diffusion region. The protective devices formed as NPN transistors have a common emitter at the second N+ diffusion region, which has enough area for storing and discharging electric charges to the ground, while the occupied area of the protective devices is maintained small. The protective devices can be formed as so-called field MOS transistors having a common source.

10 Claims, 6 Drawing Sheets

SEMICONDUCTOR DEVICE

This is a Continuation of application Ser. No. 08/084,604 filed Jul. 1, 1993, abandoned.

BACKGROUND OF THE INVENTION (a) Field of the Invention

The present invention relates to a semiconductor device and, more particularly, to a CMOS or BiCMOS semiconductor device implemented by a gate array or a standard cell.

(b) Description of the Related Art

In a CMOS or BiCMOS semiconductor device, it is usual to adopt a parasitic bipolar transistor or a parasitic MOS transistor as a protective device against an electrostatic discharge failure caused by electric charges entering from outside the semiconductor chip.

Figure 1:
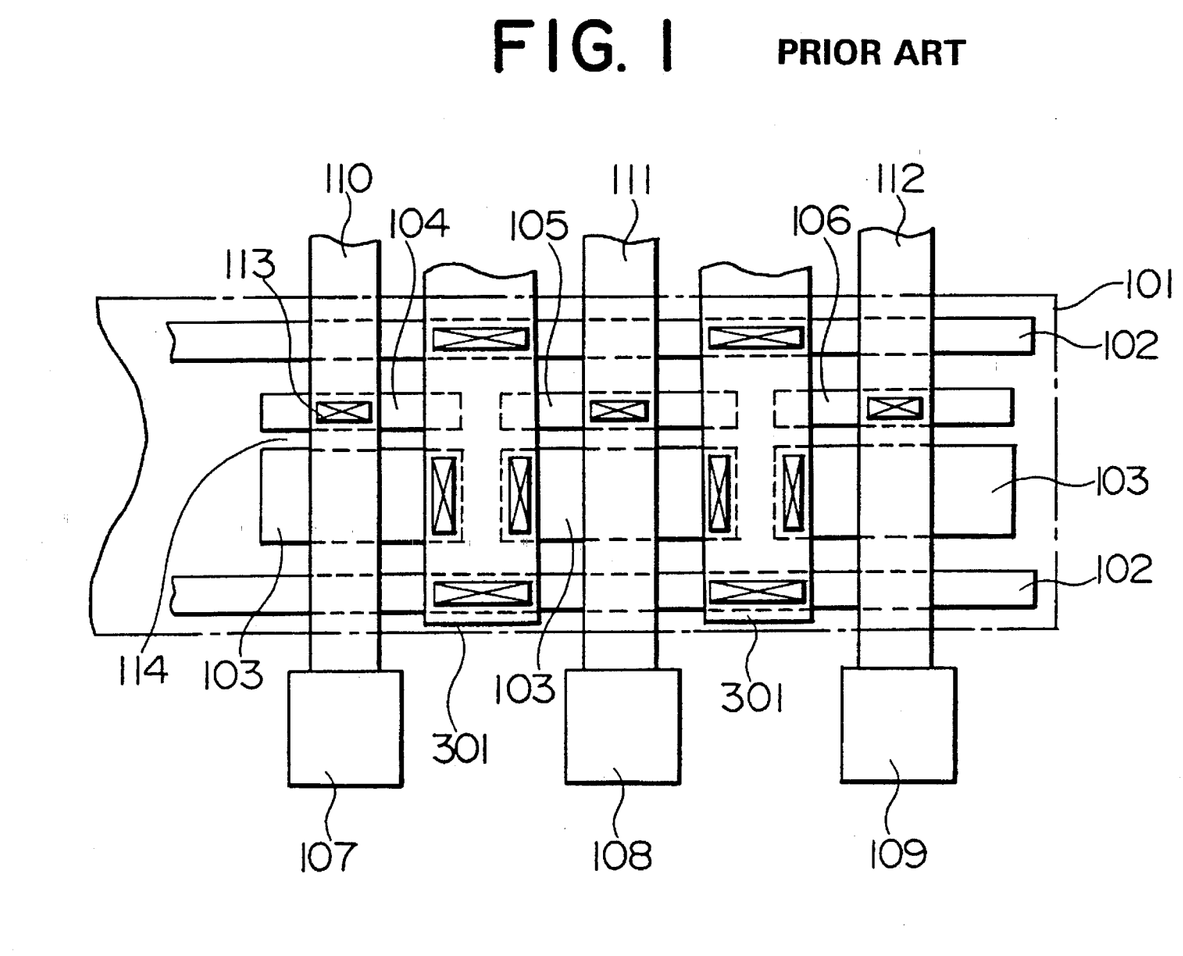
FIG.1 is a schematic plan view showing protective transistors against an electrostatic discharge failure in a conventional semiconductor device.

FIG. 1 is a schematic plan view of a conventional semiconductor device, showing bonding pads and protective NPN transistors protecting internal circuitry of the semiconductor device against an electrostatic discharge failure. A first, second and third signals inputted from the respective bonding pads 107, 108 and 109 are transmitted to the internal circuit (not shown) through the first, second and third signal lines 110, 111 and 112 each connected to the corresponding bonding pads 107, 108 and 109.

The signal lines 110, 111 and 112 are connected to first heavily doped N-type (N+) diffusion regions 104, 105 and 106, respectively, through respective contact holes 113. Each of the first N+ diffusion regions 104, 105 and 106 is formed within a P-well 101 disposed adjacent to the bonding pads 107, 108 and 109 and maintained at a ground potential by a heavily doped P-type (P$^+$) diffusion region 102 and a ground line 301 connected thereto. Second N+ diffusion regions 103 maintained at a ground potential are located opposite to the respective first N+ diffusion regions 104, 105 and 106, with separating regions disposed therebetween. The separating regions are provided with a thick insulating layer or LOCOS layer 114 on the P-well 101, the thick insulating layer 114 having a minimum width determined by a current LOCOS technology.

With the construction of the semiconductor device described above, when a potential exceeding the absolute maximum rating of the semiconductor device is applied to one of the bonding pads, pad 107 for example, the protective NPN transistor, which has a collector at the first N+ diffusion region 104, a base at the grounded P-well 101 disposed below the thick insulating layer 114 and an emitter at the grounded second N+ diffusion region 103, is turned on so that the parasitic NPN transistor diverts the injected charges through the ground line 301 away from the signal line 110 and protects the internal circuit against an electrostatic discharge failure or a dielectric breakdown.

Each of the second N+ diffusion regions 103 applied at the ground potential have an enough capacity i.e., enough area for storing and discharging the electrostatic charges injected from outside the chip, thus resulting in a large area for protective devices against the electrostatic discharge failure.

Recently, miniaturization of the transistor elements of the semiconductor device has been developed markedly with the development of the fine process technology for fabricating the semiconductor device. For example, a MOS transistor having a gate of a 0.6 µm length can be attained in the semiconductor device. With this fine structure of a semiconductor device, the withstand voltage of transistor elements tends to reduce together with the size of the elements. Hence, it is customary to reduce the operating voltage of the semiconductor device from 5 volt to, for example, equal to or below 3.3 volt. Some semiconductor devices, however, are still required to have a 2000 volt or more electrostatic withstand voltage.

On the other hand, the semiconductor device of a logic LSI is required to have more connecting pins, so that it is necessary, in the logic LSI, to reduce the pitch of the bonding pads and the area for protective devices correspondingly to the pitch of the bonding pads.

Under the circumstances as described above, the layout of a semiconductor device having protective devices against an electrostatic discharge failure has a problem in which, although the semiconductor device has an increasingly smaller chip size due to the development of the fine process technology, neither the area for the protective device nor the pitch of the bonding pads can be reduced because of the necessary area for storing and discharging the injected electric charges, thereby limiting the miniaturization of the chip size.

SUMMARY OF THE INVENTION

In view of foregoing, an object of the present invention is to provide a semiconductor device having a reduced area for protective devices by reducing the area for storing and diverting the electric charges entering from outside the semiconductor device.

According to the present invention there is provided a semiconductor device comprising a substrate, an internal circuit having a certain function and formed on the substrate, a plurality of bonding pads formed on the substrate, signal lines disposed correspondingly to the bonding pads and connected between the internal circuit and the bonding pads, respectively, a semiconductive region of a first conductive type formed in the substrate and maintained at a first potential, first diffusion regions of a second conductive type formed correspondingly to the signal lines in the semiconductive region and connected to the signal lines, respectively, an insulating layer formed at least adjacent to the first diffusion regions on the semiconductive region, a second diffusion region of the second conductive type formed opposite to the first diffusion regions in the semiconductive region, with the insulating layer disposed between the first diffusion regions and the second diffusion region, the second diffusion region being maintained at the first potential.

According to the present invention there is also provided a semiconductor device comprising a substrate, an internal circuit having a certain function and formed on the substrate, a plurality of bonding pads formed on the substrate, signal lines disposed correspondingly to the bonding pads and connected between the internal circuit and the bonding pads, respectively, a semiconductive region of a first conductive type formed in the substrate and maintained at a first potential, first diffusion regions of a second conductive type formed in the semiconductive region correspondingly to the signal lines and connected to the signal lines, respectively, an insulating layer formed on the semiconductive region at least adjacent to the first diffusion regions, a second diffusion region formed in the semiconductive region opposite to the first diffusion regions, with the insulating layer disposed between the first diffusion regions and the second diffusion region, the second diffusion region being maintained at a second potential, and a metal electrode disposed on the insulating layer between the first diffusion regions and the second diffusion region and maintained at the second potential.

With the construction as described above, the protective devices having a common source or a common active region at the second diffusion region have a sufficient area for storing and diverting electric charges entering from outside the semiconductor device, while the occupied area for the protective devices need not be larger as compared to that of the conventional semiconductor device.

BRIEF DESCRIPTION OF THE DRAWINGS

The above and other objects, features and advantages of the present invention will be more apparent from the following description, referring to the accompanying drawings in which.

DETAILED DESCRIPTION OF THE PREFERRED EMBODIMENTS

Figure 2:
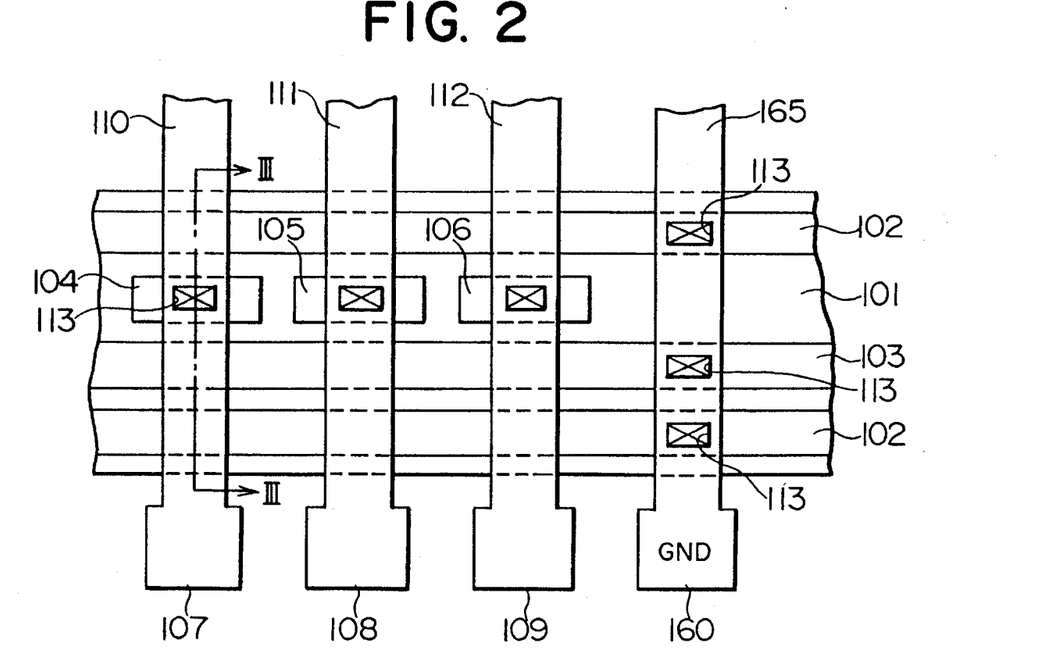
FIG. 2 is a schematic plan view illustrative of protective transistors against an electrostatic discharge failure in a semiconductor device according to a first embodiment of the present invention.
Figure 3:
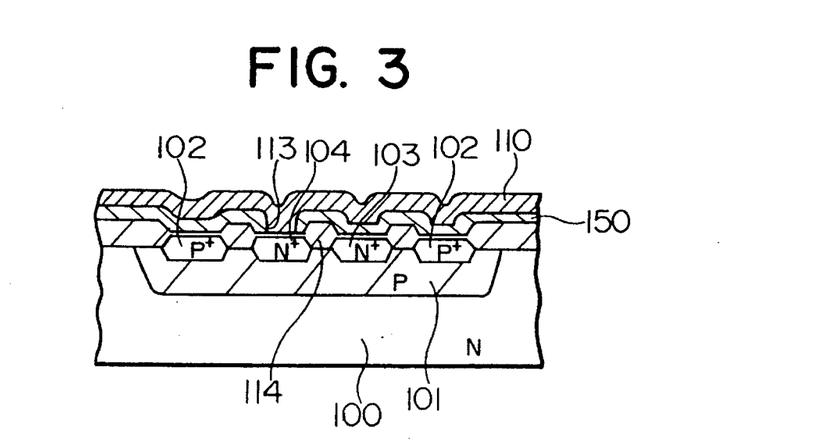
FIG. 3 is a cross-sectional view of the semiconductor device of FIG. 2, taken on a line III—III.
Figure 4A:
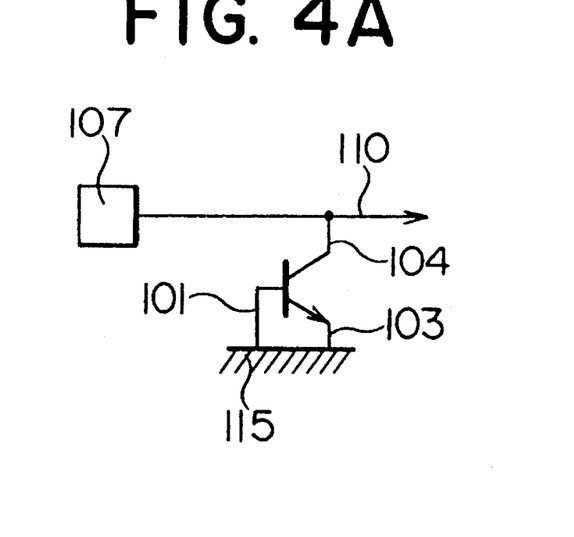
FIG. 4A is an equivalent circuit diagram of one the protective transistors of FIG. 2.

Now, the present invention will be described with reference to the drawings. FIG. 2 is a schematic plan view illustrative of protective devices against electrostatic discharge failure in an internal circuit of a semiconductor device according to a first embodiment of the present invention. FIG. 3 is a cross-sectional view of the semiconductor device of FIG. 2 taken on a line III—III in FIG. 2, and FIG. 4A is a circuit diagram showing the protective circuit including one of the protective devices of FIG. 2.

In FIGS. 2 and 3, there are shown bonding pads 107, 108 and 109 for signal lines and a bonding pad 160 for a ground line, a P-well 101 formed in an N-type silicon substrate 100, signal lines 110, 111 and 112 connected to the respective bonding pads for transmitting the input signals from the bonding pads 107, 108 and 109 to internal circuitry (not shown), and a ground line 165 connected between the bonding pad 160 and the internal circuit.

In the P-well 101, there is provided heavily doped P-type (P+) diffusion regions 102 extending along the edge portions of the P-well 101 and connected to the ground line 165 through contact holes 113, first heavily doped N-type (N+) regions 104, 105 and 106 disposed correspondingly to the signal lines 110, 111 and 112, and a second heavily doped N-type (N+) diffusion region 103 disposed opposite to the first N+ diffusion regions 104, 105 and 106 and extending along one of the P+ diffusion region 102. A thin insulating film is formed on the diffusion regions 102, 103, 104, 105 and 106, and a thick insulating layer or a LOCOS layer 114 is formed between the thin insulating layer for forming separating regions separating adjacent diffusion regions. An insulating layer 150 covering the whole area of the substrate 100 is formed on the LOCOS layer and the thin insulating film. Metal interconnections including the signal lines 110, 111 and 112 are formed on the insulating layer 150.

Each of the signal lines 110, 111 and 112 is connected at its branch portion to one of the corresponding first N+ diffusion regions 104, 105 and 106 through a corresponding contact hole 113 formed in the insulating layer 150 and the thin insulating film. In FIG. 2, the signal line 110 is shown as formed on the insulating layer 150 and connected to the corresponding first N+ diffusion region 104 through the contact hole 113.

A second N+ diffusion region 103 is connected to the ground line 165 through a contact hole 113 formed in the insulating layer 150 and the thin insulating film. The separating region separating the first diffusion regions 104, 105 and 106 from the second diffusion region 103 in the P-well 101 is of a minimum width provided by a current LOCOS technology for forming the LOCOS layer 114. With this configuration, protective transistors are formed in the P-well 101 correspondingly to the signal lines 110, 111 and 112.

As shown in FIG. 4A, one of the protective transistors has a collector at the first N+ diffusion region 104, a base at the P-well 101 connected through the P+ diffusion regions 102 to the ground 115, and an emitter at the second N+ diffusion region 103 connected to the ground 115. The collector 104 is connected to the signal line 110 connected between the bonding pad 107 and the internal circuit. Other protective transistors connected to the respective signal lines 111 and 112 have a similar configuration, as shown in FIG. 2.

In operation, when a potential exceeding the absolute maximum rating of the semiconductor device is applied to one of the bonding pads, pad 107 for example, the protective NPN transistor is turned on so that the protective NPN transistor discharges electric charges through the second N+ diffusion region 103 to the ground line 165 to protect the internal circuit against an electrostatic discharge failure.

In the situation as described above, the extent to which the the protective circuit including the protective NPN transistor withstands generally depends on the area of the second N+ diffusion region 103 serving as an emitter of the protective transistor. Since the second N+ diffusion region 103 is common to a plurality of bonding pads 107, 108 and 109 arranged in a group, the second N+ diffusion region 103 has a large area for storing and diverting electric charges, although the occupied area of the second N+ diffusion region 103 is reduced as compared to the second N-type diffusion regions of FIG. 1 as combined. The pitch of the bonding pads can be also reduced because of the structure of the second N+ diffusion region 103. The advantage attained by the embodiment can be larger when the number of the pads in the group is increased, as is the case in a gate array or a standard cell.

Figure 4B:
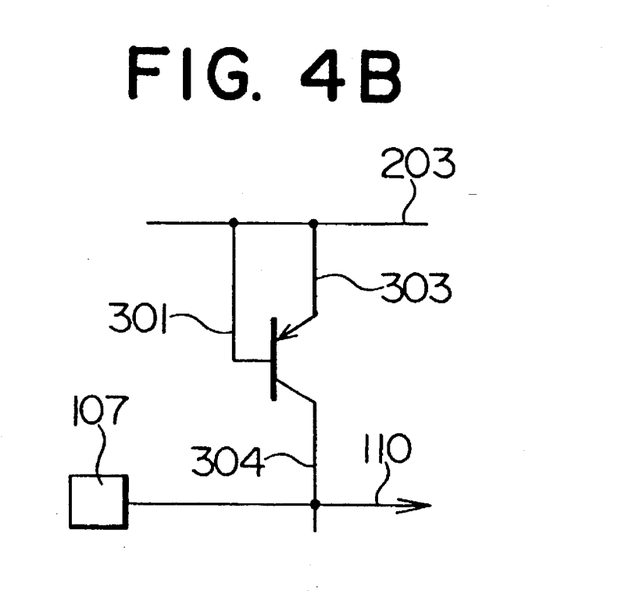
FIG. 4B is an equivalent circuit diagram of a variation of one of the protective transistors of FIG. 2.

A variation of the first embodiment is illustrated in FIG. 4B, in which a PNP transistor is provided as a protective device. When a PNP transistor is to be adopted as a protective device, an N-well connected to a source 203 is disposed adjacent to the bonding pads. The N-well 301 is provided with a plurality of first P+ diffusion region 304 connected to respective signal lines 110 and a second P+ diffusion region 303 connected to the source 203 and disposed opposite to the first P+ diffusion region 304, with a separating region disposed therebetween.

Figure 5:
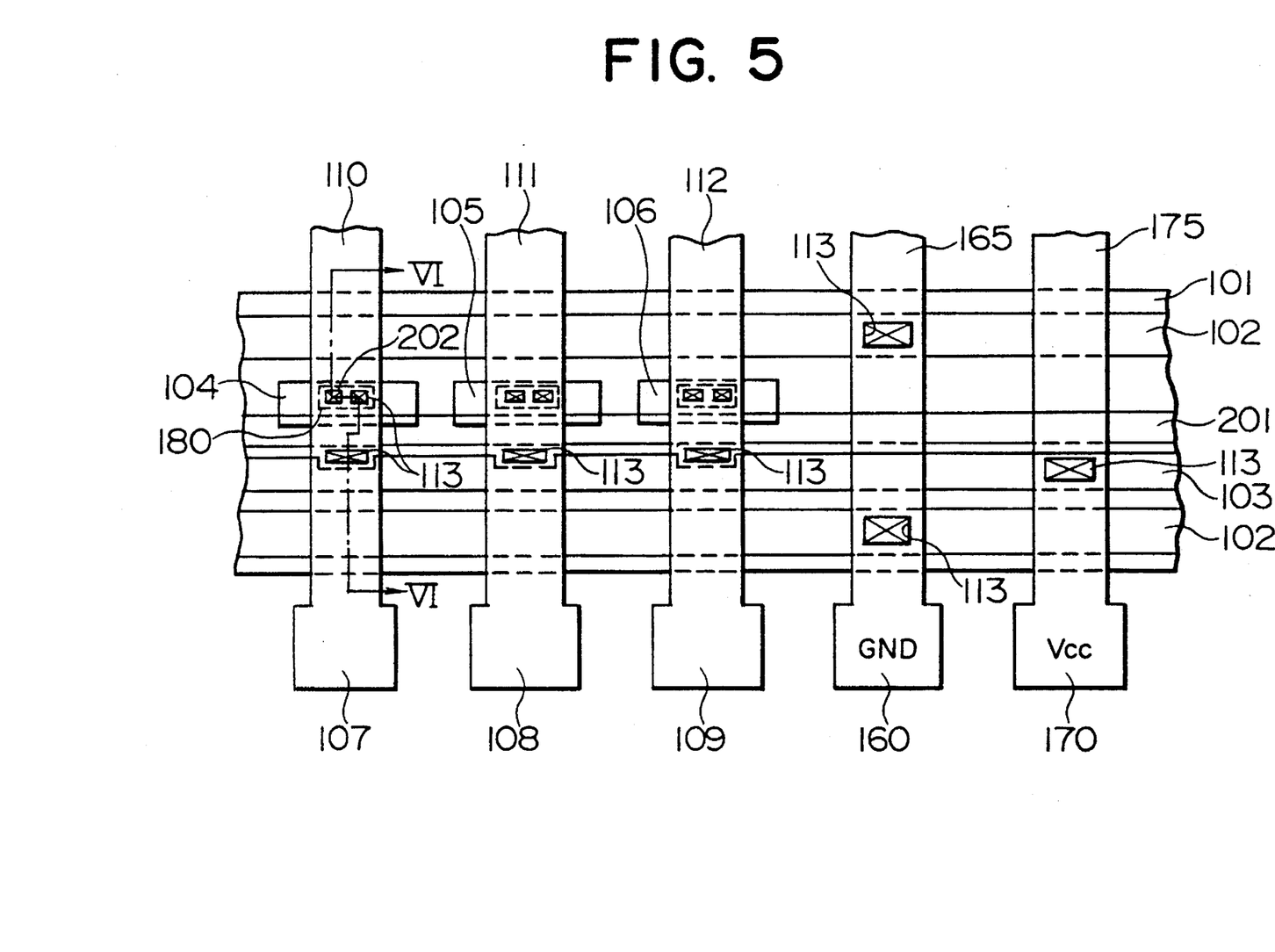
FIG. 5 is a schematic plan view illustrative of protective transistors against an electrostatic discharge failure according to a second embodiment of the present invention.
Figure 6:
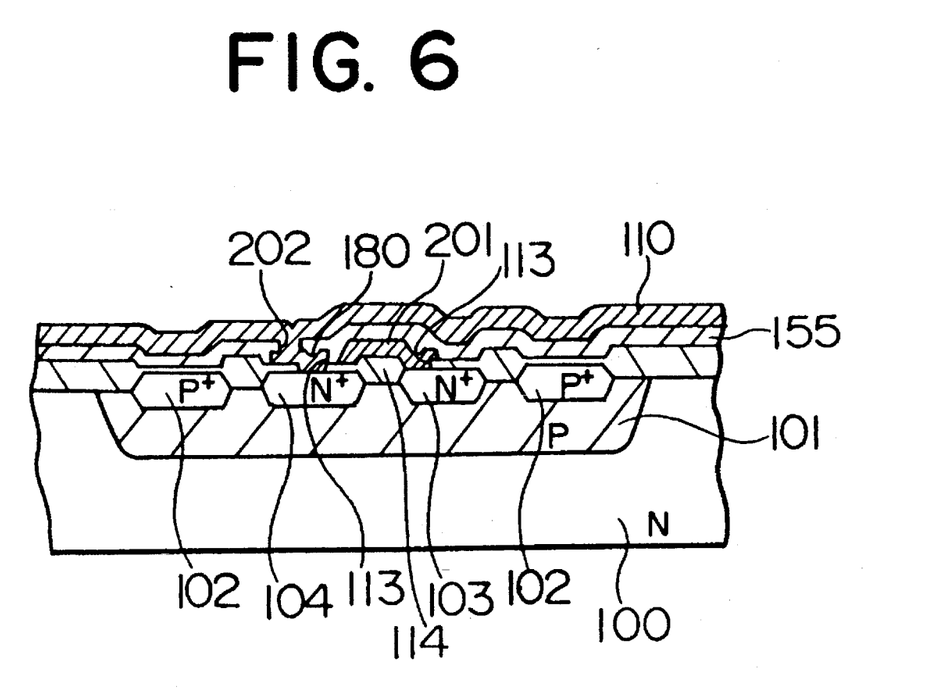
FIG. 6 is a cross-sectional view of the semiconductor device of FIG. 5, taken on a line VI—VI in FIG. 5.
Figure 7A:
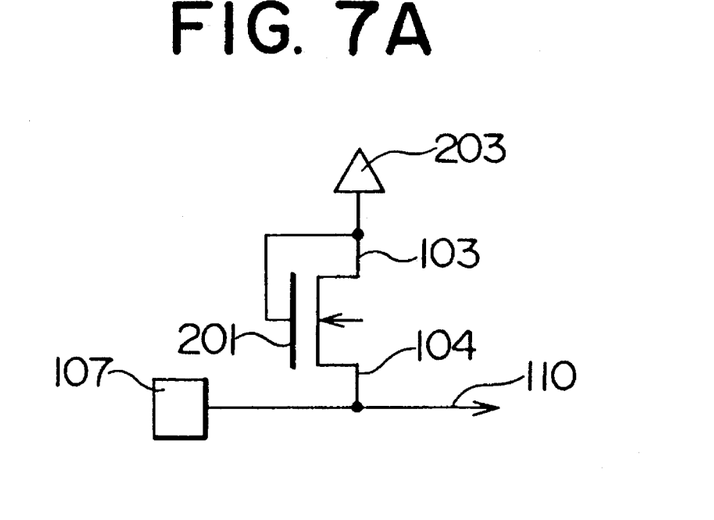
FIG. 7A is an equivalent circuit diagram of one of the protective transistors of FIG. 5.

FIG. 5 is a schematic plan view showing a second embodiment of the present invention. In FIG. 5, there are shown bonding pads 107, 108 and 109 for signal lines, and bonding pads 160 and 170 for a source line Vcc and a ground line. The protective devices protecting the internal circuitry against an electrostatic discharge failure are formed adjacent to the bonding pads 107, 108 and 109 in a P-well 101. FIGS. 6 and 7A are a cross-sectional view taken on a line VI—VI in FIG. 5 and an equivalent circuit diagram of the protective circuit including one of the protective MOS transistors of FIG. 5, respectively. The reference numerals in FIGS. 5, 6 and 7A are similar to those in FIGS. 2, 3 and 4A.

In FIG. 5 and 6, the semiconductor device comprises a silicon substrate 100, a P-well 101 within which so-called field MOS transistors are formed as the protective devices. P+ diffusion regions 102 are formed in the P-well 101 and connected to the ground line 165 for maintaining the P-well 101 at the ground potential, the P+ diffusion region 102 extending along the edge portions of the P-well 101. First N+ diffusion regions 104, 105 and 106 are formed in the P-well 101 correspondingly to the signal lines 107, 108 and 109 and adjacent to one of the P+ diffusion region 102.

A second N+ diffusion region 103 is formed opposite to the first N+ diffusion region 104, 105 and 106 and extending parallel to the other of the P+ diffusion regions 102. Each of the separating region separating one of the regions from adjacent regions by a LOCOS layer 114 is of a minimum width provided by a current LOCOS technology. A thin insulating film is formed covering the diffusion regions 102, 103, 104, 105 and 106, while a thick LOCOS layer 114 is formed between the thin insulating film, covering the separating regions and other regions.

The second N+ diffusion region 103 is connected to the source line 175 through a contact hole 113 and thereby maintained at the source potential Vcc. A gate electrode 201 of a metal is formed on the separating region separating the first N+ diffusion region 104, 105 and 106 from the second N+ diffusion region 103, the gate electrode extending parallel to the second N+ diffusion region. The metal gate electrode 201 is connected to the second N+ diffusion region 103 through a contact hole 113 and thereby maintained at the source potential Vcc, while the gate electrode 201 is separated from the first N+ diffusion region 104, 105 and 106 as shown in FIG. 6.

Metal electrodes 180 are formed as a common layer of the gate electrode 201, which is formed on the thin insulating film and connected to the first N+ diffusion region 104, 105 and 106 through contact holes 113 formed in the thin insulating film. An interlayer insulating layer 155 covering the whole area of the substrate 100 is formed on the gate electrode 201, metal electrode 180, thin insulating film and the LOCOS layer 114.

The bonding pads 107, 108 and 109, and respective signal lines 110, 111 and 112 are connected together for transmitting the input signals applied at the bonding pads 107, 108 and 109 to the internal circuit (not shown). The signal lines 110, 111 and 112 are connected at their branch portions through respective through-holes 202 to the respective metal electrodes 180, and thereby electrically connected to respective first N+ diffusion regions 104, 105 and 106.

In operation, when a potential exceeding source potential Vcc and the absolute maximum rating of the semiconductor device is applied at one of the bonding pads, pad 107 for example, the protective N-ch MOS transistor, which, as shown in FIG. 7A, has a source at the first N+ diffusion region 104 connected to the signal line 110, a gate at the metal electrode 201 connected to the electric source 203 and a drain at the second N+ diffusion region 103 connected to the electric source 203 is turned on so that injected electric charges are diverted through the source line 175 away from the signal line 110. The protective N-ch transistor thus protects the internal circuit elements against an electrostatic discharge failure.

Again in this case, the second N+ diffusion region 103 has a enough area for storing and diverting large amount of electric charges to protect the internal circuit elements. Since the area for the second N+ diffusion region 103 is common to a plurality of the bonding pads 107, 108 and 109 arranged in a group, the occupied area of the second N+ diffusion region 103 per bonding pad can be reduced as compared to that of the conventional semiconductor device, although the N+ diffusion region of FIG. 5 better stores and diverts injected electric charges.

Figure 7B:
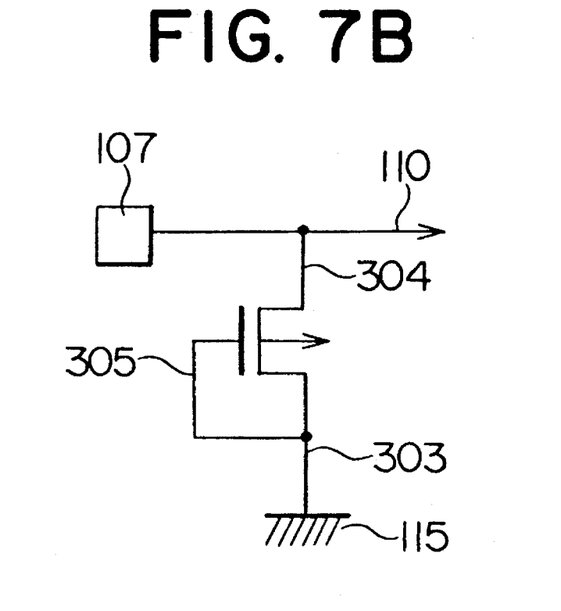
FIG. 7B is an equivalent circuit diagram of a variation of one of the protective transistors of FIG. 5.

A variation of the second embodiment is also possible as illustrated in an equivalent circuit diagram of FIG. 7B, in which a P-ch MOS transistor is shown as a protective device. When a P-ch MOS transistor is to be adopted as the protective device, an N-well connected to a source line through an N+ diffusion region disposed therein is provided adjacent to the bonding pads. A plurality of first P+ diffusion regions 304 formed within the N-well and connected to respective signal lines 110 and a second P+ diffusion region 303 connected to the ground 115 are disposed opposite to each other in the N-well, with a thick insulating layer disposed therebetween. Metal electrodes 305 connected to the ground 115 is provided above the thick insulating layer.

The P-ch protective MOS transistor protects the internal circuit against an electrostatic discharge failure caused by negative charges. The second P+ diffusion region 304 is provided as a common source region to a plurality of protective MOS transistors so that the occupied area for the second P+ diffusion region 304 per bonding pad can be reduced as compared to that of the conventional semiconductor device.

Although the present invention is described with reference to the embodiments in which the semiconductive region is constituted by a P-well or N-well, the semiconductive region in a semiconductor device according to the present invention may be a portion of a P-type or N-type semiconductor substrate.

Since above embodiments are described only for examples, the present invention is not limited to such embodiments and it will be obvious for those skilled in the art that various modifications or alterations can be easily made based on the above embodiments under the scope of the present invention.

What is claimed is:

1. A semiconductor device having a plurality of signal lines extending from associated ones of a plurality of bonding pads and a plurality of protective devices connected to associated ones of said signal lines, said semiconductor device comprising:

a semiconductor substrate;

a first semiconductor region of a first conductivity type selectively formed in said semiconductor substrate and having a plurality of first portions;

a single common second semiconductor region of a second conductivity type opposite to said first conductivity type selectively formed in said first semiconductor region and having a plurality of second portions;

a plurality of third semiconductor regions of said second conductivity type selectively formed in said first semiconductor region separately from one another and adjacently to an associated one of said second portions of said single common second semiconductor region with an intervention of an associated one of said first portions of said first semiconductor region;

each of said protective devices being constituted by an associated one of said third semiconductor regions, an associated one of said second portions of said single common second semiconductor region and an associated one of said first portions of said first semiconductor region;

an insulating film covering said first, single common second and third semiconductor regions;

each of said signal lines being formed on said insulating film to cross an associated one of said second portions of said single common second semiconductor region, an associated one of said third semiconductor regions and an associated one of said first portions of said first semiconductor region, and being isolated therefrom by said insulating film; and a plurality of contact holes each selectively formed in said insulating film to connect an associated one of said third semiconductor regions to an associated one of said signal lines.

2. A semiconductor device as defined in claim 1, wherein said insulating film includes a LOCOS layer on said first portions of said first semiconductor region.

3. A semiconductor device as defined in claim 1, wherein said single common second semiconductor region is connected to a power source.

4. A semiconductor device comprising:

a semiconductor substrate;

a semiconductor layer of a first conductivity type selectively formed in said semiconductor substrate;

a common strip region of a second conductivity type opposite to said first conductivity type selectively formed in said semiconductor layer;

a plurality of semiconductor regions of said second conductivity type selectively formed in said semiconductor layer along and adjacently to said common strip region;

an insulating film covering said semiconductor substrate, said semiconductor layer, said common strip region and said plurality of semiconductor regions;

a plurality of signal bonding pads formed on said insulating film;

a power bonding pad formed on said insulating film;

a plurality of first contact holes each selectively formed in said insulating film to expose a part of an associated one of said semiconductor regions;

a second contact hole selectively formed in said insulating film to expose a part of said common strip region;

a third contact hole selectively formed in said insulating film to expose a part of said semiconductor layer;

a plurality of signal lines each extending from an associated one of said signal bonding pads over said insulating film, so as to cross said strip region and be isolated therefrom by said insulating film while being in contact with said part of an associated one of said semiconductor regions through an associated one of said first contact holes; and a power line extending from said power bonding pad over said insulating film, so as to contact said part of said common strip region and said part of said semiconductor layer through said second and third contact holes, respectively.

5. A semiconductor device as defined in claim 4, wherein said first insulating film includes a LOCOS layer on said first region.

6. A semiconductor device as defined in claim 4, wherein said power line is connected to ground.

7. A semiconductor device comprising:

a semiconductor substrate;

a semiconductor layer of a first conductivity type selectively formed in said semiconductor substrate and having a plurality of first portions;

a common strip region of a second conductivity type opposite to said first conductivity type selectively formed in said semiconductor layer and having a plurality of second portions;

a plurality of semiconductor regions of said second conductivity type selectively formed in said semiconductor layer along said common strip region, each of said semiconductor regions facing an associated one of said second portions of said common strip region with an intervention of an associated one of said first portions of said semiconductor layer;

a first insulating film covering said semiconductor layer, said common strip region and said semiconductor regions;

a plurality of contact holes each selectively formed in said first insulating film to expose a part of an associated one of said second portions of said common strip region;

a common conductive layer selectively formed on said first insulating film to cover each of said first portions of said semiconductor layer with an intervention of said first insulating film and having a plurality of third portions each formed in contact with said part of an associated one of said second portions of said common strip region;

a second insulating film covering said first insulating film and said common conductive layer;

a plurality of signal lines each formed on said second insulating film so as to cross said semiconductor layer, said common strip region and said semiconductor regions and be isolated therefrom by said first and second insulating films;

a power line formed on said second insulating film so as to cross said semiconductor layer and said common strip region and be isolated therefrom by said first and second insulating films;

a plurality of first connection conductive layers each selectively formed in said first and second insulating films to connect an associated one of said semiconductor regions to an associated one of said signal lines; and a second connection conductive layer selectively formed in said first and second insulating films to connect said common strip region to said power line.

8. A semiconductor device as defined in claim 7, wherein said first insulating film includes a LOCOS layer on said first portions of said first semiconductor layer.

9. A semiconductor device as defined in claim 8, wherein said common conductive layer is connected to a high potential power source.

10. A semiconductor device as defined in claim 7, wherein said common conductive layer is connected to ground.

* * * * *